(12) United States Patent
Chung et al.

(10) Patent No.: US 6,361,614 B1
(45) Date of Patent: Mar. 26, 2002

(54) DARK SPIN RINSE/DRY

(75) Inventors: Bryan Chaeyoo Chung, Bethlehem; Glenn Alan Marshall, Northampton; Charles Walter Pearce, Emmaus; Kevin Paul Yanders, Germansville, all of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/510,015

(22) Filed: Feb. 22, 2000

Related U.S. Application Data

(60) Provisional application No. 60/130,378, filed on Apr. 21, 1999.

(51) Int. Cl.$^7$ ................................................. C23G 1/02
(52) U.S. Cl. ................................. 134/3; 134/2; 134/26; 134/30; 134/902; 359/885; 359/893
(58) Field of Search ............................ 134/2, 3, 26, 30, 134/113, 902; 359/885, 893

(56) References Cited

U.S. PATENT DOCUMENTS 5,834,799 A * 10/1998 Rostoker et al. .............. 257/98
6,073,361 A * 6/2000 Kramer et al. .................. 34/58

* cited by examiner

Primary Examiner—Frankie L. Stinson
Assistant Examiner—M. Kornakov

(57) ABSTRACT

A method and apparatus for eliminating the exposure of semiconductor wafers to light during rinsing and drying in wafer cleaning machines having windows is used to reduce scrap and improve the reliability of the integrated circuit devices. An opaque window assembly or a light blocking material is applied to the transparent window to prevent ambient light from entering the processing chamber of the wafer cleaning machine and thereby eliminate light-induced galvanic corrosion produced during rinsing and drying of semiconductor wafers in wafer cleaning machines having windows. This makes the fabrication of advanced integrated circuit devices of increasingly smaller dimensions feasible by eliminating the degradation in reliability caused by light-induced galvanic corrosion produced during cleaning of the semiconductor wafers. The application of a light blocking material to the transparent windows of wafer cleaning machine is cost effective and easily implemented in existing wafer cleaning machines.

12 Claims, 1 Drawing Sheet

DARK SPIN RINSE/DRY

CROSS-REFERENCE TO RELATED APPLICATION

This application claims the benefit of U.S. Provisional Application No. 60/130,378, filed Apr. 21, 1999.

BACKGROUND OF THE INVENTION

The invention disclosed herein relates generally to a method and apparatus for processing semiconductor wafers. More particularly, the present invention relates to a method and apparatus for reducing scrap and improving the reliability of integrated circuit devices during cleaning by eliminating the exposure of the semiconductor wafers to light during rinsing and drying.

A series of processing steps, known to those skilled in the art, are required to fabricate integrated circuits on semiconductor wafers. Many of these integrated circuit fabrication steps involve cleaning the semiconductor wafers prior to each new process used to form the integrated circuit devices. It is desirable to ensure that the semiconductor wafers are thoroughly cleaned by removing any remnants of prior processing, particulate contaminants and debris from the wafer surface prior to further processing. For example, after wet chemical operations, such as etching polymers, removing photoresist and removing residue, the semiconductor wafers typically undergo a cleaning process that includes chemical cleaning in a solvent or acid/solvent mixture prior to rinsing the wafers in water and then drying the semiconductor wafers.

Wafer cleaning machines typically utilize high purity wet processing to clean the semiconductor wafers. Conventional techniques used to rinse and dry the semiconductor wafers include overflow or cascade rinsing, dump rinsing, and spin rinsing/drying. In overflow rinsing, the water flows into the bottom of a processing chamber holding the wafers to be rinsed and then the water overflows or cascades into a second chamber which collects the rinse water. Dump rinsing uses the rapid deployment of water from a rinse tank to remove debris from the semiconductor wafers. In dump rinsing the water flows into the top of a processing chamber holding the wafers to be rinsed and then the bottom of the chamber is opened to allow the water to rapidly flow out of the chamber. Another technique for rinsing and drying semiconductor wafers uses a spin rinser/dryer which combines a water rinse spray with spinning the wafers in an inert gas, preferably a gas with high purity, to remove the water using centrifugal force and evaporation. It is common to combine these rinsing techniques so that the semiconductor wafers are often cleaned by overflow rinsing or dump rinsing or both, and then are further cleaned by spin rinsing/drying.

Wafer cleaning machines typically have a processing chamber with a transparent window to allow an operator to observe the rinsing and drying steps. These machines generally clean a batch of wafers at one time. The wafers are typically loaded into carriers or racks that each hold about twenty-five wafers to make handling the semiconductor wafers easier and to increase throughput during cleaning. The carriers holding the wafers are loaded into wafer cleaning machines so that cleaning of the wafers occurs while the wafers are loaded in a carrier.

The water used for rinsing, known to one skilled in the art, typically is purified, deionized water that has all of its solids, minerals and contaminants removed. The water for rinsing also typically contains carbon dioxide ("carbonated") to inhibit corrosion of the integrated circuit devices. The high purity inert gas used to dry the semiconductor wafers typically contains only trace amounts of impurities, generally on the order of parts-per-billion or parts-per-trillion of impurity content. The high purity inert gas may be comprised of gases such as nitrogen, argon, helium, carbon dioxide, hydrogen and other inert gases know to those skilled in the art.

Despite the use of carbonated water to inhibit corrosion, the front wafer in each carrier exhibits corrosion where the wafers are rinsed and dried in a conventional wafer cleaning machine having a transparent window. Typically, about one of every twenty-five wafers is scrapped due to excessive corrosion of the front wafer in a carrier of wafers that is cleaned in these machines, particularly during cleaning of wafers having integrated circuit devices with exposed metal. Even if the corrosion is not prevalent enough to immediately reject the integrated circuit devices on the front wafer, the reliability of these integrated circuits is of great concern. Although the integrated circuit devices on the front wafer may initially test as good devices, the partially missing metal lines caused by corrosion create a high current density region within the circuit, decreasing the reliability of these integrated circuits.

There is thus a need for a method and apparatus for reducing scrap and improving the reliability of integrated circuit devices by decreasing the corrosion of semiconductor wafers that are produced during rinsing and drying the wafers in conventional wafer cleaning machines having transparent windows.

SUMMARY OF THE INVENTION

It is an object of the present invention to provide a method and apparatus for reducing scrap and improving the reliability of integrated circuit devices during cleaning.

It is another object of the present invention to provide a method and apparatus for eliminating light-induced galvanic corrosion produced during rinsing and drying of semiconductor wafers in wafer cleaning machines having windows.

It is another object of the present invention to make the fabrication of advanced integrated circuit devices of increasingly smaller dimensions feasible.

It is yet another object of the present invention to provide a method and apparatus for achieving these improvements that are cost effective and easily implemented in existing wafer cleaning machines.

The above and other objects are achieved by using a light blocking material to cover the transparent window of the wafer cleaning machine while the semiconductor wafers are being rinsed and dried. Since corrosion is observed on the first wafer in a carrier, and the amount of corrosion was reduced in areas of the first wafer that are covered or shielded by the carrier, the corrosion is determined to be caused, at least in part, by the exposure of the semiconductor wafers to light during rinsing and drying. The ambient light from the room that enters the wafer cleaning machine through its transparent window provides sufficient energy to produce galvanic corrosion of the integrated circuit devices that are exposed to the light during rinsing and/or drying. The front wafer in a carrier is exposed to the greatest amount of ambient light while the other wafers are to a varying degree shielded from the light entering the transparent window of the wafer cleaning machine by the front wafer and the carrier itself. Accordingly, the front wafer in a carrier exhibits more corrosion than the other wafers in the carrier that are cleaned in the same batch since the front wafer is exposed to more light, and the light provides the energy to produce the galvanic corrosion. The light-induced galvanic corrosion is further confirmed by cleaning a carrier of wafers wherein the front wafer does not exhibit corrosion when it is reversed so that its back, and not its integrated circuit devices, is exposed to the ambient light during rinsing and drying.

By applying a light blocking material to the window, ambient room light is not permitted to enter the processing chamber of the wafer cleaning machine eliminating light-induced galvanic corrosion of the semiconductors during rinsing and drying thereby reducing scrap and improving the reliability of integrated circuit devices. The light blocking material consists of a light absorbing or a reflective material, which prevents light from entering the window of the wafer cleaning machine.

BRIEF DESCRIPTION OF THE DRAWINGS

The invention is illustrated in the figure of the accompanying drawing which is meant to be exemplary and not limiting, in which like references refer to like or corresponding parts, and in which.

DETAILED DESCRIPTION OF THE PREFERRED EMBODIMENTS

Figure 1:
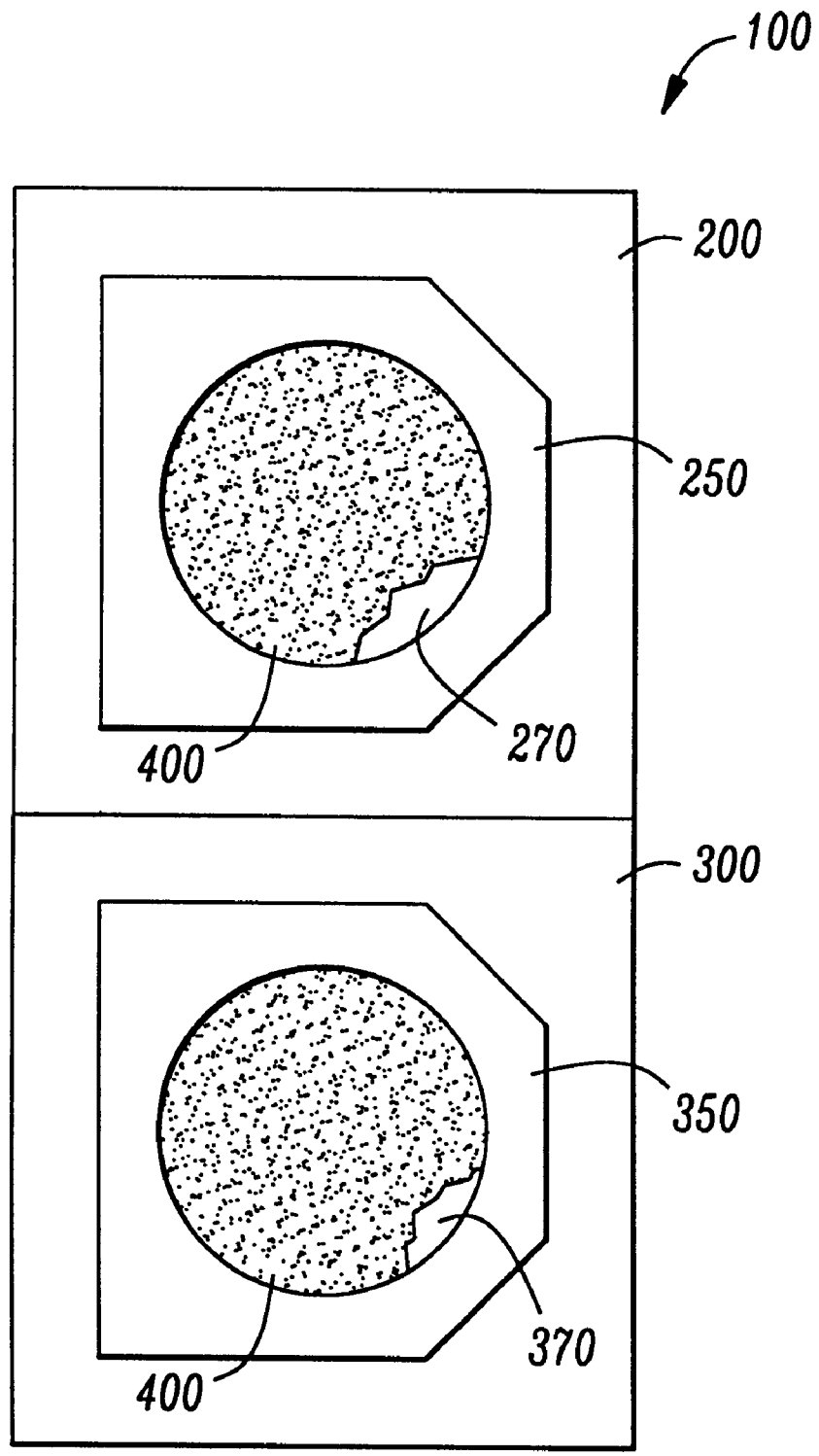
FIG. 1 is a front schematic view of a wafer cleaning machine of one embodiment of the present invention.

With reference to FIG. 1, one embodiment of the present invention is shown for a wafer cleaning machine 100 having two processing chambers, a separate rinsing chamber 200 and a rinsing/drying chamber 300. Although a dual chamber wafer cleaning machine is illustrated in FIG. 1, one skilled in the art will appreciate that the present invention applies to any rinse chamber or rinsing/drying chamber, alone or in combination, which has a window. In FIG. 1, the rinsing chamber 200 has a door 250 to allow placement of the carrier of semiconductor wafers into the rinsing chamber 200. The door 250 has a transparent window 270 through which the operator may observe the cleaning of the semiconductor wafers. As shown in FIG. 1, the rinsing/drying chamber 300 also has a door 350 with a transparent window 370.

A light blocking material 400 is applied to the transparent window 270 of the rinsing chamber 200 and to the transparent window 370 of the rinsing/drying chamber 300. The light blocking material 400 prevents light from entering the windows 270, 370 of the wafer cleaning machine 100 while the semiconductors are being cleaned. The light blocking material 400 may consist of any material, light absorbing or reflective, that prevents the ambient light from entering the rinsing chamber 200 and the rinsing/drying chamber 300, such as opaque or reflective films, foil, mirrors, cloth, window tinting, paint, solid materials, and other materials known to those skilled in the art. If the light blocking material 400 is comprised of light absorbing material, it preferably absorbs about ninety five percent or more of the ambient light. In one preferred embodiment, the light blocking material 400 is one half mil. thick Kapton film which blocks about ninety nine percent of the ultra violet light while still allowing a view into the rinsing chamber 200 and the rinsing/drying chamber 300. One skilled in the art will also recognized that other films such as PET may also be used. Light blocking material 400 that is a light absorbing film or solid material may have an adhesive applied to one side to aid in applying it to the transparent windows 270, 370. In addition to applying the light blocking material 400 to the transparent windows 270, 370 by using adhesive, the light blocking material 400 may also be applied by bolting, riveting, soldering, welding, screwing, nailing, clipping, or, for liquid materials which dry or harden into solid materials, by painting or spreading.

While the invention has been described and illustrated in connection with preferred embodiments, many variations and modifications as will be evident to those skilled in this art may be made without departing from the spirit and scope of the invention, and the invention is thus not to be limited to the precise details of methodology or construction set forth above as such variations and modification are intended to be included within the scope of the invention.

What is claimed is:

1. A method for reducing galvanic corrosion of integrated circuits devices on semiconductor wafers during cleaning in a processing chamber having a transparent window comprising:

applying a light blocking material to the transparent window of the processing chamber;

placing at least one semiconductor wafer in the chamber; and rinsing at lease one semiconductor wafer.

2. The method of claim 1 wherein applying the light blocking material comprises applying a light absorbing material to the transparent window of the processing chamber.

3. The method of claim 2 wherein the light absorbing material is selected from the group consisting of opaque or reflective films, foil, mirrors, cloth, paint and solid materials.

4. The method of claim 1 wherein applying the light blocking material comprises applying a reflective material to the transparent window of the processing chamber.

5. The method of claim 1 wherein rinsing comprises subjecting the at least one semiconductor wafer to purified water processing.

6. The method of claim 5 wherein the purified water is carbonated.

7. The method of claim 1 further comprising drying the at least one semiconductor wafer.

8. The method of claim 7 wherein applying the light blocking material comprises applying a light absorbing material to the transparent window of the processing chamber.

9. The method of claim 8 wherein the light absorbing material is selected from the group consisting of opaque or reflective films, foil, mirrors, cloth, paint and solid materials.

10. The method of claim 7 wherein applying the light blocking material comprises applying a reflective material to the transparent window of the processing chamber.

11. The method of claim 7 wherein drying comprises rotating the wafer in an inert gas.

12. The method of claim 11 where the inert gas is high purity nitrogen.

* * * * *